United States Patent [19]

Matsumoto et al.

[11] Patent Number: 4,942,423
[45] Date of Patent: Jul. 17, 1990

[54] SHEET HEATING DEVICE

[75] Inventors: Yumio Matsumoto, Kasugai; Yasuo Kimura, Ichinomiya; Osamu Takagi, Nagoya, all of Japan

[73] Assignee: Brother Kogyo Kabushiki Kaisha, Japan

[21] Appl. No.: 425,922

[22] Filed: Oct. 24, 1989

[30] Foreign Application Priority Data

Oct. 31, 1988 [JP] Japan ................................ 63-142145[U]

[51] Int. Cl.⁵ ............................................. G03B 27/52
[52] U.S. Cl. ........................................ 355/30; 219/216
[58] Field of Search ............................. 355/27, 28, 30;
219/216; 342/59, 60, 8; 430/138

[56] References Cited

U.S. PATENT DOCUMENTS 4,160,595 7/1979 Ito et al. ........................... 219/216 X

FOREIGN PATENT DOCUMENTS 0065281 4/1986 Japan .................................... 355/30

Primary Examiner—Michael L. Gellner
Assistant Examiner—Khanh Dang
Attorney, Agent, or Firm—Oliff & Berridge

[57] ABSTRACT

A sheet heating device for heating a developer sheet to fix an output image formed thereon. The sheet heating device includes a guide plate and a cover member to define an internal space therebetween. Within the space, a heater and a fan is provided. The fan generate circulating hot air stream which is directed in a traveling direction of the developer sheet. The hot air has a transversal width substantially the same as a transverse length of the developer sheet.

3 Claims, 2 Drawing Sheets

SHEET HEATING DEVICE

BACKGROUND OF THE INVENTION

The present invention relates to a sheet heating device for use in an image recording apparatus, and more particularly, to the sheet heating device which has a heater at a sheet path for heating the sheet during its travel.

Commonly assigned copending U.S. patent application Ser. No. 385,376 is filed on July 27, 1989 in which a sheet carrying a visible image is heated by a hot air, so that the sheet is not in direct contact with a heat source. More specifically, as shown in FIG. 1, a guide plate 51 is provided at a sheet path, and a pair of feed in rollers 52 and a pair of feed out rollers 53 are rotatably disposed at inlet and outlet sides of the guide plate 51. Further, a cover 54 is disposed over the guide plate 51 so as to define an internal space therebetween. In the space, there are provided a heater 55 and a hot air circulation fan 56 which generates hot air stream having a width equivalent to a lateral length of a sheet 50 which lateral length extends in a direction perpendicular to the traveling direction of the sheet 50.

The hot air stream is directed to a direction opposite the traveling direction of the sheet 50 as shown by an broken arrow in FIG. 1. In this case, the hot air may be entered below the sheet 50, and the sheet may be floated over the sheet guide plate 51 at the time of introduction of the sheet into the sheet inlet side and subsequent sheet transferring. Such sheet floating may cause sheet jamming.

SUMMARY OF THE INVENTION

It is therefore, an object of the present invention to provide an improved sheet heating device capable of avoiding sheet floating, to thereby obviate the sheet jamming within a cover member.

This and other objects of the invention will be attained by providing a sheet heating device for heating a sheet which has a lateral length, the device comprising sheet transferring means for transferring the sheet in one direction, the sheet transferring means defining a sheet path, a cover member disposed to cover the sheet path, a heat generating member disposed within the cover member and extending in a direction perpendicular to the traveling direction of the sheet, and a hot air circulation means disposed within the cover member, the circulation means generating a hot air stream having a width at least equal to the lateral length of the sheet, and directing the hot air in the sheet traveling direction.

Air within the cover member is heated by the heat generating member, and the heated air is circulated by the circulation means. In this case, the hot air flow has a width at least equal to the sheet width, and the hot air stream flows in the traveling direction of the sheet. Therefore, the sheet can be uniformly heated by the hot air, and disadvantageous floating of the sheet is avoidable because of the urging force of the air flow.

DETAILED DESCRIPTION OF THE PREFERRED EMBODIMENT

Figure 2:
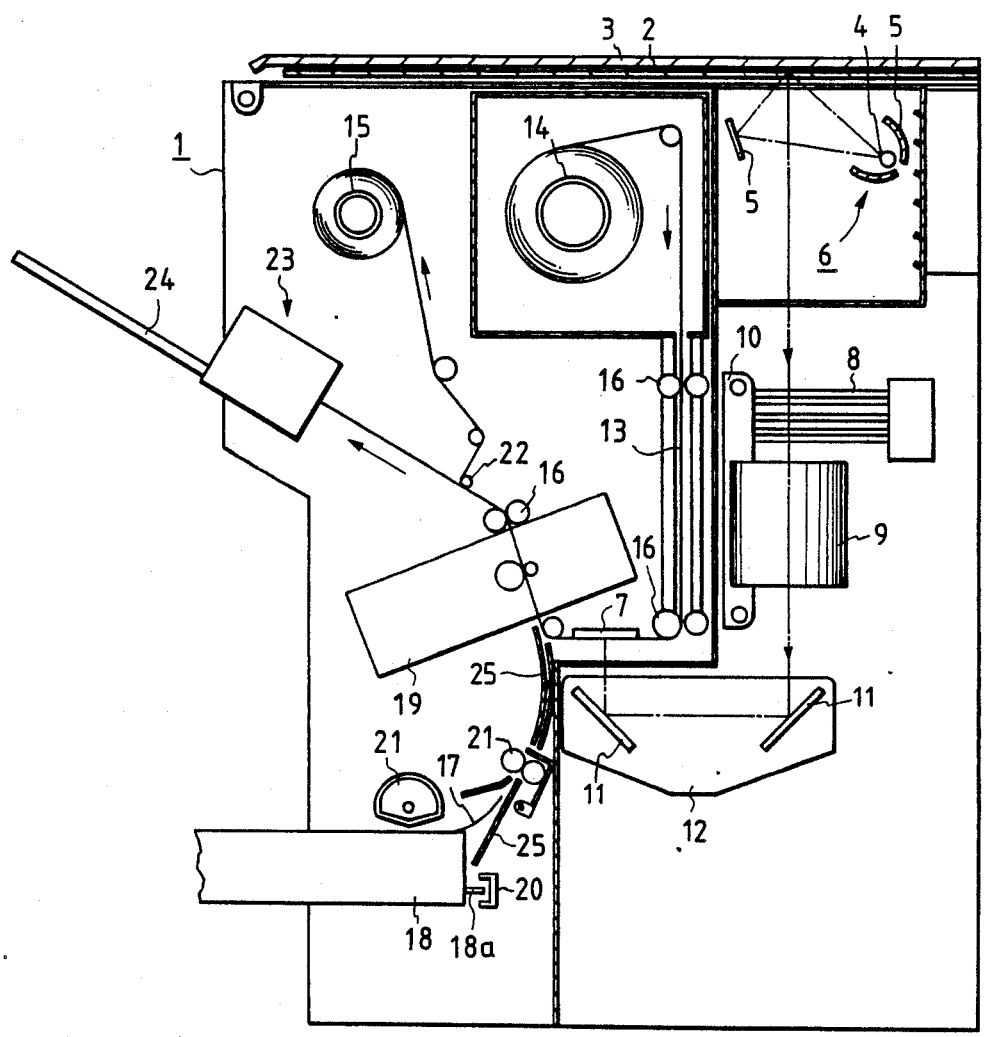
FIG. 2 is a cross-sectional elevation showing an image recording apparatus incorporating a sheet heating device according to this invention.

An image recording apparatus is shown in FIG. 2. The recording apparatus 1 pertains to a full color copying machine. At the upper portion of the apparatus 1, an original support glass 2 for mounting an original thereon and a cover 3 for selectively covering the support glass 2 are laterally movably provided. At a position below the original support glass 2, there is provided a light source 6 including a halogen lamp 4 for irradiating light to the original on the original support glass 2 and a reflector 5 for reflecting light from the halogen lamp 4 to the original support glass 2. The halogen lamp 4 extends in a direction perpendicular to the moving direction of the original support glass 2. During light emission of the light source 6, the original support glass 2 is laterally moved so that the overall area original is subjected to light irradiation.

At a central portion of the copying machine 1, an exposure stand 7 is disposed. Further, between the light source 6 and the exposure stand 7, there is provided an optical system including a color tone controlling filter unit 8, a light condensing lens unit 9 and a pair of reflection mirrors 11. The color tone controlling filter unit 8 and the lens unit 9 are attached to an attachment piece 10, whereas the pair of reflection mirrors 11 are secured to an attachment plate 12 which is movable for controlling optical path length and focal length relative to a photosensitive recording medium such as a microcapsule sheet 13 on the exposure stand 7. Therefore, light from the light source 6 is reflected at the original, and the reflected light passes through the filter unit 8, the lens unit 9 and the reflection mirrors 11, to thereby reach the exposure stand 7.

At an upper inner space of the copying machine 1, a microcapsule sheet cartridge 14 is detachably provided, and a tape-up shaft 15 is rotatably provided. In the sheet cartridge 14, stored is the rolled microcapsule sheet 13 carrying microcapsules which encapsulate therein chromogenic material for color copying. A plurality of feed rollers 16 are rotatably provided so as to feed the elongated microcapsule sheet 13 from the sheet cartridge 14. The thus pulled-out microcapsule sheet 13 passes through the exposure stand 7 where the sheet 13 is exposed to light in order to form a latent image thereon. The sheet 13 is taken up by the take-up shaft 15.

Below the exposure stand 7, a developer sheet cassette 18 is detachably provided which stores a stack of cut developer sheets 17. Further, a pressure developing unit 19 is provided between the exposure stand 7 and the tape-up shaft 15. The light exposed portion of the microcapsule sheet 13 and the developer sheet 17 are in close contact with each other and these are pressed together at the pressure developing unit 19. Consequently, a colored visible image corresponding to the latent image is formed on the developer sheet 17.

The cassette 18 is provided with a protrusion 18a whose shape is indicative of a kind of the developer sheet 17. Further, a sheet size identifying means 20 is provided in a main body of the copying machine 1. This identifying means 20 identifies the size or shape of the protrusion 18a to determine the kind or size of the developer sheet 17.

Between the developer sheet cassette 18 and the pressure developing unit 19, a plurality of feed rollers 21 and a sheet guide 25 are provided for delivering the developer sheet 17 toward the pressure developing unit 19. Further, a separation roller 22 is provided at exit side of the pressure developing unit 19 for separating the microcapsule sheet 17 from the developer sheet 17. Furthermore, at downstream side of the separation roller 22, a sheet heating device 23 is provided for thermally fixing an output image on the developer sheet 23. At downstream side of the sheet heating device 23, a sheet tray 24 is provided for receiving the developer sheet carrying the final output image.

Upon manipulation of a start button (not shown), the original support glass 2 is moved to one direction (rightwardly in FIG. 2), so that a left edge of the original is brought into confrontation with the halogen lamp 4, and thereafter, the halogen lamp 4 is turned on. The original support glass 2 is then moved to opposite direction (leftwardly in FIG. 2) during which the original is successively subjected to light exposure.

At the same time, the microcapsule sheet 13 is moved toward the take-up shaft 15 at the speed equal to the moving speed of the original support glass 2. Therefore, a latent image corresponding to the original image is successively formed on the microcapsule sheet 13 when it is traveled through the exposure stand 7. On the other hand, each one of the developer sheet 17 is delivered from the sheet cassette 18 to the pressure developing unit 19 in synchronism with the every leftward movement of the original support glass 2. The latent image portion of the microcapsule sheet 13 and the developer sheet 17 are pressed together at the pressure developing unit 19, so that a colored visible image is formed on the developer sheet 17. Thereafter, the developer sheet 17 is introduced into the sheet heating device or the thermal fixing unit 23 by means of the feed rollers 16 so as to fix the color image on the sheet 17, and is then discharged onto the discharge tray 24.

Next, the sheet heating device 23 according to this invention will be described.

Figure 1:
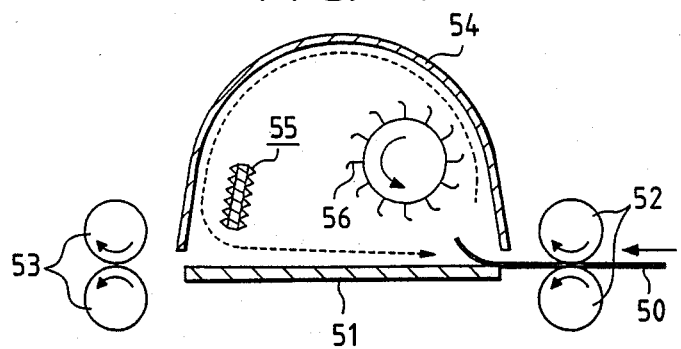
FIG. 1 is a cross-sectional view showing a sheet heating device disclosed in a copending U.S. patent application Ser. No. 385,376.
Figure 3:
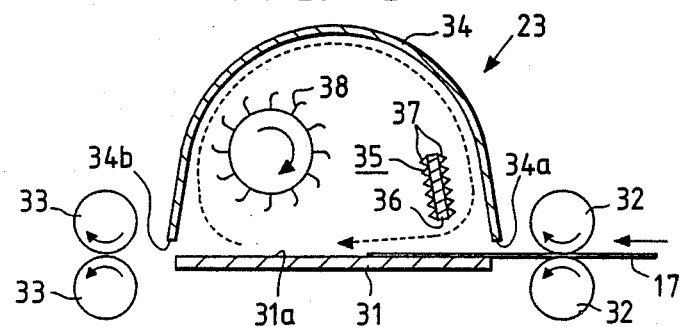
FIG. 3 is a cross-sectional view showing a sheet heating device according to one embodiment of this invention.
Figure 4:
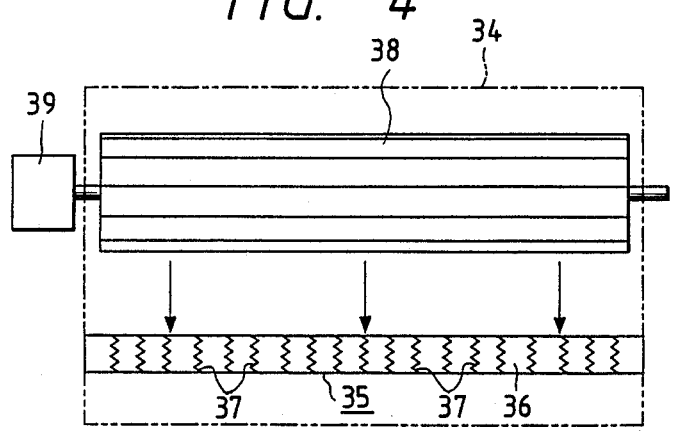
FIG. 4 is a plane view of the sheet heating device according to the embodiment.

As shown in FIGS. 3 and 4, a guide plate 31 formed of an iron and having a sheet transferring surface 31a is provided at a sheet path. A sheet transferring means such as rollers 32 and 33 are provided. More specifically, a pair of feed in rollers 32 and a pair of feed-out rollers 33 are rotatably supported at positions inlet and outlet sides of the guide plate 31, respectively. These rollers 32,33 extend in a direction perpendicular to the traveling direction of the developer sheet 17. Upon rotation of these rollers, the developer sheet 17 is transferred along the sheet transferring surface 31a of the guide plate 31.

A cover member 34 is disposed over the guide plate 31. The cover member covers the upper surface of the guide plate 31 and is formed with a sheet inlet 34a and a sheet outlet 34b at both sides thereof. Consequently, an internal space is defined by the guide plate 31 and the cover member 34.

A heat generating member 35 is disposed at inlet side of the internal space as best shown in FIG. 3. As shown in FIG. 4, the heat generating member 35 includes an adiabatic substrate 36 formed of an electrically insulative material and a coil heater 37. The adiabatic substrate 36 extends in a direction parallel with a wall of the cover member 34 at its inlet side, and has a length substantially equal to the lateral length of the sheet 17. The coil heater 37 is spacedly wound over the substrate 35, and each spirals extend in vertical direction. When an electrical current is applied to the coil heater 37, ambient air is heated.

Within the internal space, a hot air circulation fan 38 is provided at exit side. The circulation fan 38 has a rotation axis extending in parallel with the feed rollers 32,33. A rotation shaft of the circulation fan 38 is coupled to a drive motor 39 positioned outside the cover member 34. The fan 38 is rotatable in one direction (clockwise direction in FIG. 3) so as to generate air stream along the wall of the cover member 34 and along the developer sheet 17. More specifically, the air stream shown by a broken line in FIG. 3 is heated at the heat generating member 35, and the hot air first reaches the inlet side of the cover member 34 and is then directed in a traveling direction of the developer sheet 17.

With the structure, upon actuation of the coil heater 37 and the fan 38, hot air stream having a width substantially the same as the lateral length of the sheet 17 is flowed in the traveling direction of the developer sheet 17. By the rotation of the feed-in rollers 32, the developer sheet 17 is introduced into the internal space of the cover member 34 through the sheet inlet 34a, and the sheet 17 is discharged through the sheet outlet 34b by the feed-out rollers 33. During the period, the developer sheet 17 is heated by the hot air stream so as to fix the output image thereon.

In the embodiment described above, since the hot air stream is formed having a width substantially equal to the lateral length of the sheet 17, and since the hot air is flowed in a traveling direction of the sheet 17, prevented is the hot air from entering into a space defined between the developer sheet 17 and the guide plate 31. Accordingly, the sheet floating is avoidable, to thereby obviate sheet jamming within the cover member 34. In other words, the hot air stream flowing along the cover member 34 is directed downwardly, so that the sheet 17 is urged toward the guide plate 31, which in turn prevents the hot air from entering below the sheet 17.

Further, in this embodiment, the developer sheet 17 is uniformly heated, since the hot air stream having a width covering the entire lateral length of the sheet 17 is applied thereto. Therefore, resultant output image has high quality. Furthermore, the heat generating member is consist of the adiabatic substrate 36 and the coil heater 37. Therefore, a compact heat generating member is provided so as to effectively make use of the internal space of the cover 34, and resultant sheet heating device has compact size. Incidentally, instead of the feed-in, feed-out rollers as the sheet transferring means, an endless transferring belt is also available. Moreover, the sheet heating device is also available for a monochromatic copying machine.

While the invention has been described in detail and with reference to specific embodiment thereof, it would be apparent to those skilled in the art that various changes and modifications may be made therein without departing from the spirit and scope of the invention.

What is claimed is:

1. A sheet heating device for heating a sheet which has a lateral length, the device comprising:
   sheet transferring means for transferring the sheet in one direction, the sheet transferring means defining a sheet path;

a cover member disposed to cover the sheet path;

a heat generating member disposed within the cover member and extending in a direction substantially perpendicular to the traveling direction of the sheet; and a hot air circulation means disposed within the cover member, the circulation means generating a hot air stream having a width at least equal to the lateral length of the sheet, and directing the hot air in the sheet traveling direction.

2. The sheet heating device as claimed in claim 1, wherein the cover member has generally vertical walls where a sheet inlet and a sheet outlet are formed, the heat generating member extending in parallel with the vertical wall.

3. The sheet heating device as claimed in claim 2, wherein the sheet comprises a developer sheet for color copying.

* * * * *